United States Patent [19]
Chabbert et al.

[11] Patent Number: 5,608,325
[45] Date of Patent: Mar. 4, 1997

[54] METHOD OF RECALIBRATING A BATTERY ENERGY MANAGEMENT PROCESSOR

[75] Inventors: Philippe Chabbert, Rueil Malmaison; Alain Chatenay, Marly le Rot; Christian Menard, Villenes sur Seine; Dominique Meux, Toulouse, all of France

[73] Assignee: Thomson-CSF, Paris, France

[21] Appl. No.: 411,696

[22] PCT Filed: Jul. 26, 1994

[86] PCT No.: PCT/FR94/00933

§ 371 Date: Apr. 6, 1995

§ 102(e) Date: Apr. 6, 1995

[87] PCT Pub. No.: WO95/04937

PCT Pub. Date: Feb. 16, 1995

[30] Foreign Application Priority Data

Aug. 6, 1993 [FR] France .................................... 93 09714

[51] Int. Cl.$^6$ .............................. G01N 27/416; H02J 7/04
[52] U.S. Cl. ................................................ 324/426; 320/48
[58] Field of Search ....................... 324/426, 427, 324/428, 429, 430, 433, 434; 320/48, 21; 340/636

[56] References Cited

U.S. PATENT DOCUMENTS 5,352,982  10/1994  Nakazawa et al. ...................... 324/427
5,539,318  7/1996  Sasaki .................................... 324/427

Primary Examiner—Sandra L. O'Shea
Assistant Examiner—Roger Phillips
Attorney, Agent, or Firm—Oblon, Spivak, McClelland, Maier & Neustadt, P.C.

[57] ABSTRACT

The method of recalibrating an energy management processor of a battery of accumulators consists, at the end of a defined period of time, in initiating a process of recalibration of evaluation of the quantity of electrical energy contained in the battery, in completely recharging the battery, in detecting the end of the complete recharge of the battery, in performing a partial discharge of the battery, in measuring the quantity of electricity extracted during this discharge, in leaving the battery to rest for a defined time, in totally discharging the battery at a low current while measuring the quantity of electricity thus extracted from the battery, in adding the said two quantities of electricity measured in order to obtain the value of the maximum capacity of the battery at the moment of the recalibration.

20 Claims, 1 Drawing Sheet

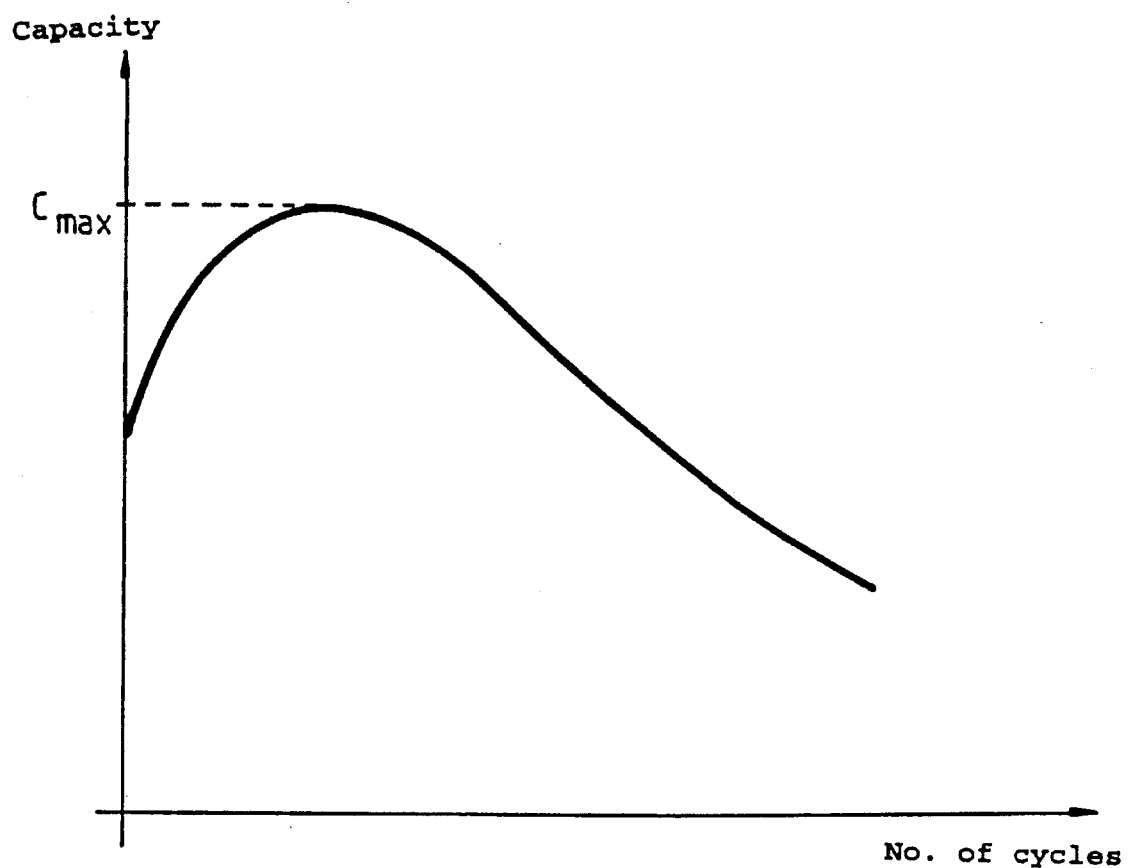

METHOD OF RECALIBRATING A BATTERY ENERGY MANAGEMENT PROCESSOR

BACKGROUND OF THE INVENTION

1. Field of the Invention

The present invention relates to a method of recalibrating a battery energy management processor.

2. Discussion of the Background

A self-contained vehicle with electric traction can be used only in an urban area on condition of knowing, as accurately as possible, the remaining endurance which its traction accumulator batteries can provide it with. The reining endurance of the vehicle corresponds to the distance or to the time for which the car can drive before exhausting the electric charge contained in these traction accumulator batteries. Knowledge of the remaining endurance of the vehicle is derived from knowledge of two factors. The first of these factors, Which is subjective, concerns the consumption of the vehicle over the journeys to come. This consumption depends in particular on the profile of the route, on the density of the traffic and on the mode of driving by the driver. The second factor, which is objective, concerns the charge which is recoverable at any instant from the traction battery.

The current devices indicating the recoverable charge, called gauges, are based on a measurement of the voltage at the terminals of the battery (Curtis-type devices, etc.). The accuracy of these devices is lower than 20% of the rated capacity for a new battery, and degrades considerably as a function of aging: the estimation error may exceed 50%.

Other devices are known, which here will be called "battery energy management processors", which measure the quantities of electricity alternately extracted and stored in the batteries managed by these processors, as well as the alteration in the maximum capacity of the batteries throughout their life. The evaluation of the quantities of energy actually stored in the batteries is only approximated, since the algorithm used is based on a weighted algebraic sum of the electrical current strengths measured in series with the managed batteries, and since the value of the maximum capacity of the batteries alters considerably as a function of the age and of the random aspects of use of the batteries. The errors made in each term of the algebraic sum (measurement errors, but also errors in the calculation of the energy actually stored by the charges, or available for discharges, and in the maximum capacity) cause the accuracy of the prediction of the available energy quantity to drift over time.

SUMMARY OF THE INVENTION

The subject of the present invention is a method making it possible to cancel out or greatly to reduce the drift in accuracy of the prediction of the quantity of electrical energy available in a battery, this method making it possible to maintain an accuracy which is markedly better than that of the known gauges, throughout the whole life of the battery.

The method of the invention consists, at the end of a defined period of time, in initiating a process of recalibration of evaluation of the quantity of electrical energy contained in the battery, in completely recharging the battery, in detecting the end of the complete recharge of the battery, in performing a partial discharge of the battery, in measuring the quantity of electricity extracted during this discharge, in leaving the battery to rest for a defined time, in totally discharging the battery at a low current while measuring the quantity of electricity thus extracted from the battery, in adding the said two quantities of electricity measured in order to obtain the value of the maximum capacity of the battery at the moment of the recalibration.

BRIEF DESCRIPTION OF THE DRAWING

The present invention will be better understood on reading the detailed description of an embodiment, taken by way of non-limiting example and illustrated by the attached drawing, in which the single figure is a diagram showing the alteration in the maximum capacity of an accumulator as a function of the number of charge and discharge cycles.

DETAILED DESCRIPTION OF THE PREFERRED EMBODIMENT

The invention is described below by reference to a traction accumulator battery for an electric vehicle, but it is clearly understood that it is not limited to such a type of accumulator, and that it can be implemented for various types of accumulators, from the simple accumulator for a small portable appliance up to a large set of back-up accumulators for a fixed, high-power installation. These accumulators may be of various technologies: lead, cadmium-nickel type, etc. For the sake of simplicity, in the remainder of the text, the term battery will be used to designate any one of these accumulators or sets of accumulators.

The recalibration consists of a series of operations automatically controlled by a battery energy management processor and/or of manual operations performed by the owner of the electric vehicle. This management processor, for example of the abovementioned known processor type, furthermore makes it possible to carry out the five main operations described below, called recalibration operations overall.

1st Operation: The Recalibration Request

The energy management processor computes the time elapsed since the last recalibration. As soon as this duration exceeds a fixed limit (depending on the performance, in terms of accuracy, of the algorithm for evaluating the charge in the battery), a signal is sent out by the energy management processor in order to request the driver to take the recalibration actions as soon as possible. The signal may, for example, be a "recalibration request" indicator lamp placed on the dashboard of the vehicle and kept lit until the last recalibration operation. In fact, from this instant, the accuracy of evaluation of the quantity of energy remaining in the battery can no longer be guaranteed by the energy management processor.

2nd Operation: The Complete Recharging of the Battery

From the sending of the "recalibration request" signal, the driver of the vehicle should completely recharge the battery, as soon as possible, with a charger guaranteeing a recharging method achieving a complete charge (for example: "IUi" charger for Pb traction batteries, IU chargers for NiCd traction batteries, etc.). These types of chargers are "intelligent" chargers which monitor the current strength injected over time into the battery and the voltage at the terminals of the battery with the aim of maximizing the charge stored in a battery without destroying it or degrading it.

The end of the complete recharging is detected by the energy management processor. This detection can be carried out in several ways: for example, with the aid of a signal sent by the charger or by evaluation of the state of charge of the battery under charge by the energy management processor (the processor should then incorporate the optimal charging algorithms which can be used by the charger in order to judge the moment when the complete charging of the battery is reached).

The information "end of complete recharge" of the battery enables the energy management processor to undertake the following operation. This signal can be physically represented, for example, by setting the "recalibration request" indicator light to rapid flashing.

3rd Operation: The Partial Discharging of the Battery

The driver of the vehicle uses his vehicle normally until reaching at least a given depth of discharge (for example: 10 to 20%, a value displayed on the gauge meter of the dashboard, the counter driven by the energy management processor). When this limit is reached, a signal allows the following phase to be entered. This signal can be represented physically, for example, by setting the "recalibration request" indicator lamp to slow flashing.

During this third operation, the energy management processor computes the Ah (Ampere-hours) extracted from the battery.

Even partial recharging of the battery interrupts the correct progress of the recalibration and dictates starting again from the beginning of the second operation.

4th Operation: Letting the Battery Rest

The driver of the vehicle returns his vehicle for a minimum stipulated time (for example, for a sealed lead traction battery between 1 hour 30 minutes and 3 hours). During this period, the battery recovers all of its available charge. In fact, during the preceding phase, driving speeds with heavy currents stress the batteries and make a certain charge quantity inaccessible. This charge quantity again becomes available after the batteries have been allowed to rest (phenomenon of battery relaxation).

The energy monitoring processor computes this duration.

At the end of this period, a signal (automatically or otherwise) triggers the following phase. This signal can be represented physically, for example, by setting the "recalibration request" indicator lamp to slow flashing.

Even partial recharging of the battery interrupts the correct progress of the recalibration and dictates starting again from the beginning of the second operation.

The use of the vehicle (discharge at high current strength) interrupts the correct operation of the recalibration and dictates starting again from the beginning of the fourth operation, and thus extends the rest period.

5th Operation: The Total Discharging of the Battery at Low Current Strength—Recording of the New Reference Value of Cmax(t)

This phase, triggered automatically by the signal for the end of the fourth phase, consists in the complete discharging of the battery at low current strength (for example $<1/5$ of $I_5$), $I_5$ being the discharge current making it possible completely to discharge the battery in five hours. This discharging is carried out by connecting a secondary consumer unit of the vehicle (for example headlamps) by the energy management processor, or by driving at low speed (for example, the driver, by his driving, limits the quantity of energy which is not instantaneously accessible).

The energy management processor disconnects the consumer unit as soon as:

either the minimum allowable voltage (Vmin) of the battery is reached (V(t) or V(t)/Vmin is monitored, for example), or the drift, with respect to time, of the reduction in the battery voltage reaches a maximum allowable value.

During this discharging, the charge extracted is computed and added to the charge computed during the third operation in order, at the end of the fifth operation, to obtain the exact value of Cmax(t), which is the maximum capacity of the battery at the current instant t.

When the minimum allowable battery voltage is reached, an "end of calibration" signal is sent. It causes the resetting of the current value of the charge contained in the battery, the initialization of Cmax(t) to the sum of the charges extracted from the battery during operations 3 and 5, and the turning-off of the "recalibration request" indicator lamp.

The new value of Cmax(t), recorded in the non-volatile memory of the battery energy management processor is used:

as a basis for evaluation of charge stored in the battery until the next recalibration request (cf. first operation), as a basis for evaluating the lifetime of the battery, as information on the use made by the driver of the electric vehicle (for example: degradation through excessive chargings, rapid uncontrolled chargings, overheating or operation at very low temperature).

We claim:

1. A method of recalibrating a previously calibrated energy management processor of a battery of accumulators, comprising the steps of:

at the end of a defined period of time after said previous calibration, initiating a process of determining the quantity of electrical energy contained in the battery, completely recharging the battery, detecting the end of the complete recharge of the battery, performing a partial discharge of the battery, measuring the quantity of electrical energy extracted during this discharge, leaving the battery at rest for a defined time, totally discharging the battery at a low current while measuring the quantity of electrical energy thus extracted from the battery, adding the said two quantities of electrical energy measured in order to obtain the value of the maximum capacity of the battery at the moment of the recalibration.

2. Method according to claim 1, wherein a complete recharging of the battery is detected by a battery charger.

3. Method according to claim 1, wherein a complete recharging of the battery is detected by the battery energy management processor.

4. Method according to claim 1, wherein a partial discharging of the battery is carried out in the normal pattern of use of the battery.

5. Method according to claim 1, wherein the battery is allowed to rest for a minimum time which is sufficient for the battery to recover all its available charge.

6. Method according to claim 1, wherein, if, during the time when the battery is resting, the battery is partially recharged, and the recalibration method is restarted by recommencing the complete recharging of the battery.

7. Method according to claim 1, characterized in that if, during the time when the battery is resting, the battery is accidentally discharged at high current, the period for which it rests is extended.

8. Method according to claim 1, wherein the complete discharging of the battery takes place for a current providing for it to be completely discharged in about 5 hours.

9. Method according to claim 8, wherein the complete discharging of the battery is stopped when the voltage at its terminals reaches a minimum admissible value.

10. Method according to claim 8, wherein the complete discharging of the battery is stopped when the drift with respect to time of the reduction in the voltage of the battery reaches a maximum admissible value.

11. Method according to claim 10, wherein said battery is a traction battery for an electric vehicle.

12. Method according to claim 11, wherein the complete discharging of the battery is performed on at least one element of the vehicle.

13. Method according to claim 2, characterized in that the partial discharging of the battery is carried out in the normal pattern of use of the battery.

14. Method according to claim 3, characterized in that the partial discharging of the battery is carried out in the normal pattern of use of the battery.

15. Method according to claim 2, characterized in that the battery is allowed to rest for a minimum time which is sufficient for the battery to recover all its available charge.

16. Method according to claim 3, characterized in that the battery is allowed to rest for a minimum time which is sufficient for the battery to recover all its available charge.

17. Method according to claim 4, characterized in that the battery is allowed to rest for a minimum time which is sufficient for the battery to recover all its available charge.

18. Method according to claim 2, characterized in that if, during the time when the battery is resting, the battery is partially recharged, the recalibration method is restarted by recommencing the complete recharging of the battery.

19. Method according to claim 3, characterized in that if, during the time when the battery is resting, the battery is partially recharged, the recalibration method is restarted by recommencing the complete recharging of the battery.

20. Method according to claim 4, characterized in that if, during the time when the battery is resting, the battery is partially recharged, the recalibration method is restarted by recommencing the complete recharging of the battery.

* * * * *